United States Patent
Takata et al.

(10) Patent No.: US 6,370,060 B2
(45) Date of Patent: Apr. 9, 2002

(54) SEMICONDUCTOR MEMORY DEVICE

(75) Inventors: Masahiro Takata, Tenri; Hidekazu Takata, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/836,949

(22) Filed: Apr. 17, 2001

(30) Foreign Application Priority Data

Apr. 24, 2000 (JP) .......................................... 12-123239

(51) Int. Cl.[7] ............................................... G11C 16/06
(52) U.S. Cl. .............................. 365/185.21; 365/185.2; 365/210
(58) Field of Search ........................ 365/185.2, 185.21, 365/185.24, 189.07, 210

(56) References Cited

U.S. PATENT DOCUMENTS

| | | | | |
|---|---|---|---|---|
| 4,884,241 A | * | 11/1989 | Tanaka et al. | 365/185.21 |
| 5,091,888 A | * | 2/1992 | Akaogi | 365/210 |
| 5,148,063 A | * | 9/1992 | Hotta | 365/185.21 |
| 5,191,552 A | * | 3/1993 | Nakai et al. | 365/185.21 |
| 5,659,503 A | * | 8/1997 | Sudo et al. | 365/185.2 |

* cited by examiner

*Primary Examiner*—Son Mai
(74) *Attorney, Agent, or Firm*—Morrison & Foerster LLP

(57) ABSTRACT

A semiconductor memory device includes a plurality of memory banks each including a plurality of memory cells, one of which is selectable in accordance with an address signal; a memory bit line for receiving a read voltage from the selected memory cell; a reference cell for outputting a reference voltage; a reference bit line for receiving the reference voltage; a comparison and amplification device for amplifying a difference between a voltage from the memory bit line and a voltage from the reference bit line; and a load capacitance adjusting device for providing a third load capacitance to the reference bit line so that a first load capacitance between the selected memory cell and the comparison and amplification device is substantially equal to a second load capacitance between the reference cell and the comparison and amplification device.

7 Claims, 6 Drawing Sheets

SEMICONDUCTOR MEMORY DEVICE

BACKGROUND OF THE INVENTION

1. Field of the Invention

The present invention relates to a semiconductor memory device for reading data after comparing a voltage level of data read from a memory cell and a reference voltage level and amplifying the difference between the levels, such as, for example, a mask ROM, an EPROM, a flash memory and a ferroelectric memory.

2. Description of the Related Art

Conventionally, this type of semiconductor memory device reads data by comparing a voltage level of data read from a memory cell and a preset reference voltage level and amplifying the difference between the levels.

FIG. 6 is a circuit diagram of a semiconductor memory device 100 as an example of conventional semiconductor memory devices. As shown in FIG. 6, the semiconductor memory device 100 includes a memory cell array 110, a row decoder 120 for outputting a signal to one of a plurality of word lines W0 through Wn which is selected by an address signal AS, and a column decoder 130 for selecting one of a plurality of bit lines B00 through B0n by outputting a signal to one of a plurality of column selection signal lines Ba0 through Bam which is selected by the address signal AS.

The memory cell array 110 includes a plurality of memory cells MC each formed of a MOS transistor arranged in a matrix, the plurality of word lines W0 through Wn, and the plurality of bit lines B00 through B0n. In a row direction, n memory cells MC are provided, and a column direction also, n memory cells MC are provided.

Control gates G of the n memory cells MC on each row are commonly connected to the corresponding word line W. In more detail, the control gates G of the memory cells MC000 through MC0n0 on row 0 are commonly connected to the word line W0. The control gates G of the memory cells MC00n through MC0nn on row n are commonly connected to the word line Wn.

Drains D of the n memory cells MC on each column are commonly connected to the corresponding bit line B. In more detail, the drains D of the memory cells MC000 through MC00n on column 0 are commonly connected to the bit line B00. The drains D of the memory cells MC0n0 through MC0nn on column n are commonly connected to the bit line B0n. Sources S of the memory cells MC in each column are commonly connected and grounded.

Outputs of the row decoder 120 are respectively connected to the word lines W0 through Wn. In accordance with the value of a row selection signal of an input address signal AS, the row decoder 120 outputs a word line selection signal to a selected word line W.

The column decoder 130 includes a column pre-decoder 131 and switching transistors ST00 through ST0n each forming a switching circuit. Each switching circuit is turned on by a column selection signal sent from the column pre-decoder 131.

For reading data from the memory cell array 110, the column pre-decoder 131 outputs a column selection signal, decoded from the input address signal AS, to one of the column selection signal lines Ba0 through Bam.

The switching transistors ST00 through ST0n are respectively connected to the bit lines B00 through B0n. The column selection signal sent from the column pre-decoder 131 is sent to a gate of one of the switching transistors ST which is selected by the column selection signal, and the switching transistor ST which receives the column selection signal connects the corresponding bit line B to a memory bit line BB0.

The semiconductor memory device 100 further includes a switching circuit 140 for adjusting a resistance value of a reference bit line BBr, a reference circuit 150 for setting a reference voltage level, a sense block 160 for comparing the set reference voltage level and a voltage level from a memory cell MC and amplifying the difference between the levels so as to output the memory data, and an output circuit 170 for sending the output from the sense block 160 to the outside of the semiconductor memory device 100.

The switching circuit 140 includes a switching transistor STref. An ON resistance of the switching transistor STref is controlled so that a total resistance value of the memory bit line BB0 and selected bit line B (B00 through B0n) equals the reference bit line BBr. In other words, when a voltage having an equal value to that of an active voltage sent to the selected column selection signal lines Ba is input to a gate of the switching transistor STref, an ON resistance of the selected switching transistor ST in the column decoder 130 and the ON resistance of the switching transistor STref are equal to each other.

The reference circuit 150 includes a reference word line (Wref) control circuit 151 for receiving a read control signal and a reference cell Tref. The reference cell Tref includes a control gate G connected to a reference word line Wref, a drain D connected to the reference bit line Bref, and a source S which is grounded.

The sense block 160 includes a precharge circuit 162 connected to the memory bit line BB0 through a switch 161, a bias circuit Bias0 connected to the memory bit line BB0, a precharge circuit 164 connected to the reference bit line BBr through a switch 163, a bias circuit Biasr connected to the reference bit line BBr, and a sensing amplifier SA. One of two inputs (i.e., input B0) of the sensing amplifier SA is connected to an output of the bias circuit Biaso, and the other input (i.e., input Br) of the sensing amplifier SA is connected to an output of the bias circuit Biasr. For reading data, the sensing amplifier SA compares the preset reference voltage level and the voltage level of data of the memory bit line BB0 and amplifies the difference between the voltage levels, which is output to the outside of the semiconductor memory device 100.

The precharge circuit 162 performs a precharge operation so as to charge, at a high speed, a floating capacitance (or a parasitic capacitance) of the bit line B selected by the switching transistors ST00 through ST0n. When the floating capacitance is fully charged, the precharge circuit 162 turns off the switch 161 to stop the precharge operation. The precharge circuit 164 has the same structure as that of the precharge circuit 162.

The bias circuit Bias0 includes a feedback circuit 165, a transistor T1 (n-channel transistor for a transfer gate), and a reference resistance R. The feedback circuit 165 includes a reference resistance r and a transistor t which are connected in series as shown in FIG. 7. A connection point a' between the reference resistance r and the transistor t is connected to a gate of the transistor T1. A gate of the transistor t is connected to the memory bit line BB0. The feedback circuit 165 can have a different configuration from the configuration shown in FIG. 7. The bias circuit Biasr includes a feedback circuit 165 and a transistor T2, and has substantially the same configuration as that of the bias circuit Bias0.

The output circuit 170 includes an output control circuit 171 and an output buffer 172 for temporarily storing data.

The output circuit 170 outputs the outputs from the sensing amplifier SA to the outside of the semiconductor memory device 100 sequentially.

The semiconductor memory device 100 having the above-described structure operates as follows.

An address signal AS is input to the row decoder 120. In accordance with the value of a row selection signal of the input address signal AS, the row decoder 120 sends a word line selection signal to a selected word line W (more specifically, to the control gates G of the memory cells MC of the selected row). The address signal is also input to the column pre-decoder 131. In accordance with the value of a column selection signal of the input address signal AS, the column pre-decoder 131 sends a column selection signal to a selected column selection signal line Ba. Then, the column selection signal is output to the gate of the corresponding switching transistor ST. The bit line B which is connected to the switching transistor ST is placed into a conductive state.

In this manner, a desired voltage is applied to the selected word line W and the selected column selection signal line Ba based on the input address signal AS. One of the memory cells MC is selected based on the selected word line W and the selected column selection signal line Ba. The memory bit line BB0 obtains a voltage based on a threshold voltage of the selected memory cells MC as described below.

When the threshold voltage of the selected memory cell MC is set to be higher than the desired voltage applied on the word line W, the selected memory cell MC (e.g., MC000) is not placed into a conductive state. Therefore, a charging current from the precharge circuit 162 is shielded by the memory cell MC000 connected to the precharge circuit 162 via the switching transistor ST00, and thus the voltage of the memory bit line BB0 is maintained high. As a result, the transistor t (FIG. 7) in the feedback circuit 165 is placed into a conductive state so as to make the voltage of the connection point a' low, thus placing the transistor T1 into a high resistance state (i.e., off state). Accordingly, when the threshold voltage of the selected memory cell MC is set to be higher than the desired voltage applied on the word line W, the input B0 of the sensing amplifier SA is supplied with a voltage through the resistance R so as to have a high voltage level.

When the threshold voltage of the selected memory cell MC is set to be lower than the desired voltage applied on the word line W, the selected memory cell MC (e.g., MC000) is placed into a conductive state. Therefore, a charging current from the precharge circuit 162 flows through the memory cell MC000, and thus the voltage of the memory bit line BB0 is maintained low. As a result, the transistor t (FIG. 7) in the feedback circuit 165 is not placed into a conductive state, and thus the voltage of the connection point a' becomes high. The transistor T1 is placed into a low resistance state (i.e., on state). Accordingly, when the threshold voltage of the selected memory cell MC is set to be lower than the desired voltage applied on the word line W, the input B0 of the sensing amplifier SA has a low voltage level.

Hereinafter, the reference voltage to be input to the other input Br of the sensing amplifier SA will be described.

When a read control signal is input to the Wref control circuit 151 from outside, the Wref control circuit 151 applies a voltage to the word line Wref which is connected to the gate G of the reference cell Tref. The voltage applied by the Wref control circuit 151 has an equal value to that of the voltage applied to the gate G of the memory cell MC in the memory cell array 110. This way, the reference cell Tref is adjusted to have an appropriate threshold voltage so that the reference voltage input to the input Br of the sensing amplifier SA is at a substantially middle point between the high level and the low level which can be applied to the input B0 of the sensing amplifier SA by the function of the precharge circuit 164 and the bias circuit Biasr. During such an operation, the switching transistor STref is in a conductive state.

The high level or low level voltage which is input to the input B0 and the reference voltage which is input to the input Br are compared with each other, and the difference between the voltage levels is amplified by the sensing amplifier SA. Output signals from the sensing amplifier SA are temporarily stored in the output buffer 172 after passing through the output control circuit 171, and then sequentially output to the outside of the semiconductor memory device 100.

Hereinafter, a floating capacitance existing in the semiconductor memory device 100 will be described. Generally, as in this example, the memory bit line BB0 is connected to a plurality of memory cells MC parallel to each other through the switching transistors ST00 through ST0n. Therefore, the bit lines B00 through B0n need to be sufficiently long to be connected to the plurality of memory cells MC. In such a structure, a relatively large floating capacitance exists. The precharge circuit 162 performs a precharge operation so as to charge, at a high speed, a floating capacitance of the bit line B selected by the switching transistors ST00 through ST0n, and stops the precharge operation when the floating capacitance is fully charged. In other words, the precharge circuit 162 performs a precharge operation before the sensing amplifier SA starts operating. During the operation of the sensing amplifier SA, the precharge circuit 162 is separated from the memory bit line BB0 by the switch circuit 161 and thus does not perform a precharge operation.

When the floating capacitance of the memory bit line BB0 and the floating capacitance of the reference bit line BBr are different, the precharge time period of the memory bit line BB0 and the precharge time period of the reference bit line BBr are different. Accordingly, when the sensing amplifier SA starts operating when the shorter precharge period is terminated, the longer precharge period is still not terminated and thus the sensing amplifier SA undesirably outputs wrong data (wrong data read).

In order to avoid this problem, the conventional semiconductor memory device 100 includes a load capacitor having a load capacitance Cr in connection with the reference bit line BBr, so that the floating capacitance of the memory bit line BB0 and the floating capacitance of the bit line BBr can be adjusted to be equal to each other.

The load capacitor Cr for adjustment provides a sufficient effect in a structure shown in FIG. 6 where one memory bit line BB0 is connected to one sense block 160, but does not provide a sufficient effect in a structure including a plurality of banks. Herein, the term "bank" is defined as a group of memory cell arrays which are connected to one, same identical bit line.

FIG. 8 is a schematic block diagram illustrating a structure of a conventional semiconductor memory device 200 including banks 0A through mA. Identical elements previously discussed with respect to FIG. 6 bear identical reference numerals and the detailed descriptions thereof will be omitted.

As shown in FIG. 8, the semiconductor memory device 200 includes the banks 0A through mA, and each bank includes a plurality of memory cell arrays 110. Bit lines B00 and B02 from one memory cell array 110 and bit lines B01 and B03 from other memory cell arrays 110 are connected to a bit line BB0_0 respectively through the switching transistors ST00, ST02, ST01 and ST03. These two memory cell arrays 110; the bit lines B00, B01, B02 and B03; the switching transistors ST00, ST01, ST02 and ST03; and the bit line BB0_0 form bank 0A (0'th bank).

Bit lines B10, B11, ..., and B1n from still another two memory cell arrays 110 are connected to a bit line BB0_1 respectively through the switching transistors ST10, ST11, ..., and ST1n. These two memory cell arrays 110; the bit lines B10, B11, ..., and B1n; the switching transistors ST10, ST11, ..., and ST1n; and the bit line BB0_1 form bank 1A (1st bank).

Bit lines Bm0, Bm1, ..., and Bmn from still another two memory cell arrays 110 are connected to a bit line BB0_m respectively through the switching transistors STm0, STm1, ..., and STmn. These two memory cell arrays 110; the bit lines Bm0, Bm1, ..., and Bmn; the switching transistors STm0, STm1, ..., and STmn; and the bit line BB0_m form bank mA (m'th bank). The components in each bank are connected to a respective bit line (one of bit lines BB0_0 through BB0_m).

The bit lines BB0_0 through BB0_m are connected to memory bit lines BB0 respectively through switching transistor STb0 through STbm. The memory bit lines BB0 are connected to the sense block 160. Gates of the switching transistor STb0 through STbm are respectively connected to bank selection lines Bsa0 through Bsam. To each of the bank selection signal lines Bsa0 through Bsam, a bank selection signal BSS (a signal indicating the bank which includes the memory cell to be accessed) can be input. The bank selection signal BSS is generated by a bank decoder circuit 180. More specifically, the bank decoder circuit 180 decodes a bank selection signal from an input address signal AS and outputs the bank selection signal BSS to the corresponding bank selection signal line BSa.

Switching transistors STrefo and STrefb connected in series to each other are connected between the reference circuit 150 and the sense block 160 so that a resistance of one of the memory bit lines BB0 and a total resistance of the reference bit line BBr are equal to each other, like the switching transistor STref shown in FIG. 6. Since the structure of FIG. 8 includes two stages of switching transistors ST00 through STmn for bit line selection and STb0 through STbm for bank selection (which are connected in series), the reference bit line BBr is also connected to two transistors STrefc and STrefb so as to match the resistance of one of the memory bit lines BB0 and the resistance of the reference bit line BBr.

A floating capacitance existing in the semiconductor memory device 200 shown in FIG. 8 will be described. The floating capacitances of different bit lines BB0_0 through BB0_m are varied in accordance with, for example, the number of switching transistors connected thereto (i.e., the size of the corresponding memory cell array 110) and the distance between the corresponding memory cell array 110 and the sense block 160 (i.e., the length of the bit line). As more banks are provided, the difference among the floating capacitances from the banks to the sense block 160 is enlarged.

When a floating capacitance is added to the reference bit line BBr so as to have an equal floating capacitance to that of the bank having a relatively small floating capacitance, data can be properly read from such a bank, but cannot be properly read from a bank having a larger floating capacitance for the following reason. Since the floating capacitance of the reference bit line BBr is smaller than that of the memory bit line BB0, the precharge operation for the memory bit line BB0 is not completed when the precharge operation for the reference bit line BBr is completed. When the sensing amplifier SA starts reading data at this point, the data is incorrectly read.

When a floating capacitance is added to the reference bit line BBr so as to have an equal floating capacitance to that of the bank having a relatively large floating capacitance, data can be properly read from such a bank, but the following inconvenience occurs for reading data from a bank having a smaller floating capacitance. Since the floating capacitance of the reference bit line BBr is larger than that of the memory bit line BB0, the precharge operation for the memory bit line BB0 is completed before the precharge operation for the reference bit line BBr is completed. The access is delayed by the time from the completion of the precharge operation for the memory bit line BB0 until the completion of the precharge operation for the reference bit line BBr.

In addition, when the precharge circuits 162 and 164 (FIG. 6) included in the sense block 160 complete the charging operation for the memory bit line BB0 and the reference bit line BBr, namely, when the precharge circuits 162 and 164 are separated from the memory bit line BB0 and the reference bit line BBr, a coupling noise (potential fluctuation) is generated in the memory bit line BB0 and the reference bit line BBr. The level of the coupling noise depends on the value of the floating capacitances of the memory bit line BB0 and the reference bit line BBr. When the floating capacitance is different between the memory bit line BB0 and the reference bit line BBr, the coupling noise is also different between the memory bit line BB0 and the reference bit line BBr. Then, a potential difference is generated between the memory bit line BB0 and the reference bit line BBr, thus reducing the sensing margin.

As described above, so long as a semiconductor memory device includes a plurality of banks, like the semiconductor memory device 200, the sensing margin is necessarily reduced and the sensing speed is lowered at some of the memory cells. The difference in the floating capacitance between the memory bit line BB0 and the reference bit line BBr varies in accordance with the production process, length of the bit lines, size of the memory cell arrays, and the bank structure, but generally is several pF to several tens of pF including the line capacitance, the diffusion capacitance connected to the line capacitance, and the gate capacitance. This value increases as the chip area increases and as the process becomes more precise.

SUMMARY OF THE INVENTION

A semiconductor memory device according to the present invention includes a plurality of memory banks each including a plurality of memory cells, one of which is selectable in accordance with an address signal; a memory bit line for receiving a read voltage from the selected memory cell; a reference cell for outputting a reference voltage; a reference bit line for receiving the reference voltage; a comparison and amplification device for amplifying a difference between a voltage from the memory bit line and a voltage from the reference bit line; and a load capacitance adjusting device for providing a third load capacitance to the reference bit line so that a first load capacitance between the selected memory cell and the comparison and amplification device is substantially equal to a second load capacitance between the reference cell and the comparison and amplification device.

According to the present invention, an adjusting load capacitor having a load capacitance which is substantially equal to that of the memory bank selected by the address signal is connected to the reference bit line. Even when the number of banks is increased or decreased, the load capacitance from the memory cell to the sensing amplifier can be equal to the load capacitance from the reference cell to the sensing amplifier. The sensing margin is improved, and the access time (i.e., sensing speed) is reduced.

In one embodiment of the invention, the load capacitance adjusting device includes a plurality of load capacitance elements having a respective load capacitance, and a plurality of first switching devices for electrically connecting at least one of the plurality of load capacitance elements to the reference bit line.

According to the present invention, a plurality of first switching devices each connected to a plurality of load capacitors are provided. The load capacitors are switched over so that the load capacitance of the memory bit line and the load capacitance of the reference bit line can be equal to each other. Therefore, the structure of the load capacitance adjusting circuit can be simplified.

In one embodiment of the invention, the semiconductor memory device further includes a plurality of bank selection signal lines respectively connected to the plurality of memory banks for receiving a bank selection signal for selecting one of the plurality of memory banks which includes the selected memory cell, wherein the plurality of first switching devices are respectively connected to the plurality of bank selection signal lines.

According to the present invention, a signal for selecting a bank is also used for switching the first switching device. Therefore, the structure of the load capacitance adjusting circuit can be simplified.

In one embodiment of the invention, the semiconductor memory device further includes a plurality of bank selection signal lines respectively connected to the plurality of memory banks for receiving a bank selection signal for selecting one of the plurality of memory banks which include the selected memory cell, wherein the load capacitance adjusting device further includes a logic circuit which is connected to the plurality of first switching devices for controlling switching of the plurality of first switching devices in accordance with the bank selection signal.

According to the present invention, the load capacitors are combined appropriately by a logic circuit which receives a bank selection signal, so that the load capacitance of the memory bit line and the load capacitance of the reference bit line can be equal to each other. Therefore, it is not necessary to provide one load capacitor for each bank. The number of load capacitors can be reduced.

In one embodiment of the invention, the load capacitance adjusting device includes second switching devices between respective adjacent load capacitance elements of the plurality of load capacitance elements, and controls each of the second switching devices to be on or off so as to provide the third load capacitance to the reference bit line.

In one embodiment of the invention, the plurality of load capacitance elements are divided into a group of first load capacitance elements, a total load capacitance of which forms the third load capacitance to be provided to the reference bit line when the selected memory cell is in a first memory bank among the plurality of memory banks, and a group of second load capacitance elements, a total load capacitance of which forms the third load capacitance to be provided to the reference bit line when the selected memory cell is in a second memory bank among the plurality of memory banks, as a result of each of the plurality of second switching devices being controlled to be on or off.

In one embodiment of the invention, the load capacitance adjusting device further includes a third switching device and a fourth switching device both connected to the reference bit line, wherein the third switching device is connected to one of two ends of the plurality of load capacitance elements which are connectable via the second switching devices, and the fourth switching device is connected to the other of the two ends of the plurality of load capacitance elements.

The third and fourth switching devices each include a switching transistor which is controlled by a bank selection signal for selecting either a first memory bank or a second memory bank. The load capacitance elements can be connected or disconnected by use of transistors, or by connecting or cutting conductive lines. The first memory bank and the second memory bank are designed to be variable in the areas.

According to the present invention, when the size of the memory cell arrays in each bank is varied in correspondence with the use of the semiconductor memory device or the system configuration while the total size of the memory cell arrays is kept the same, the load capacitance of the bit line can be adjusted to be equal to the load capacitance of the reference bit line. Thus, the sensing margin is improved, and the access time (i.e., sensing speed) is reduced.

Thus, the invention described herein makes possible the advantages of providing a semiconductor memory device for improving the sensing margin and reducing the access time.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

In the following description, the expression "the load capacitance of the memory bit line" refers to the "load capacitance from the selected memory cell to the sensing amplifier"; and the expression "the load capacitance of the reference bit line" refers to the "load capacitance from the reference cell to the sensing amplifier".

EXAMPLE 1

Figure 1:
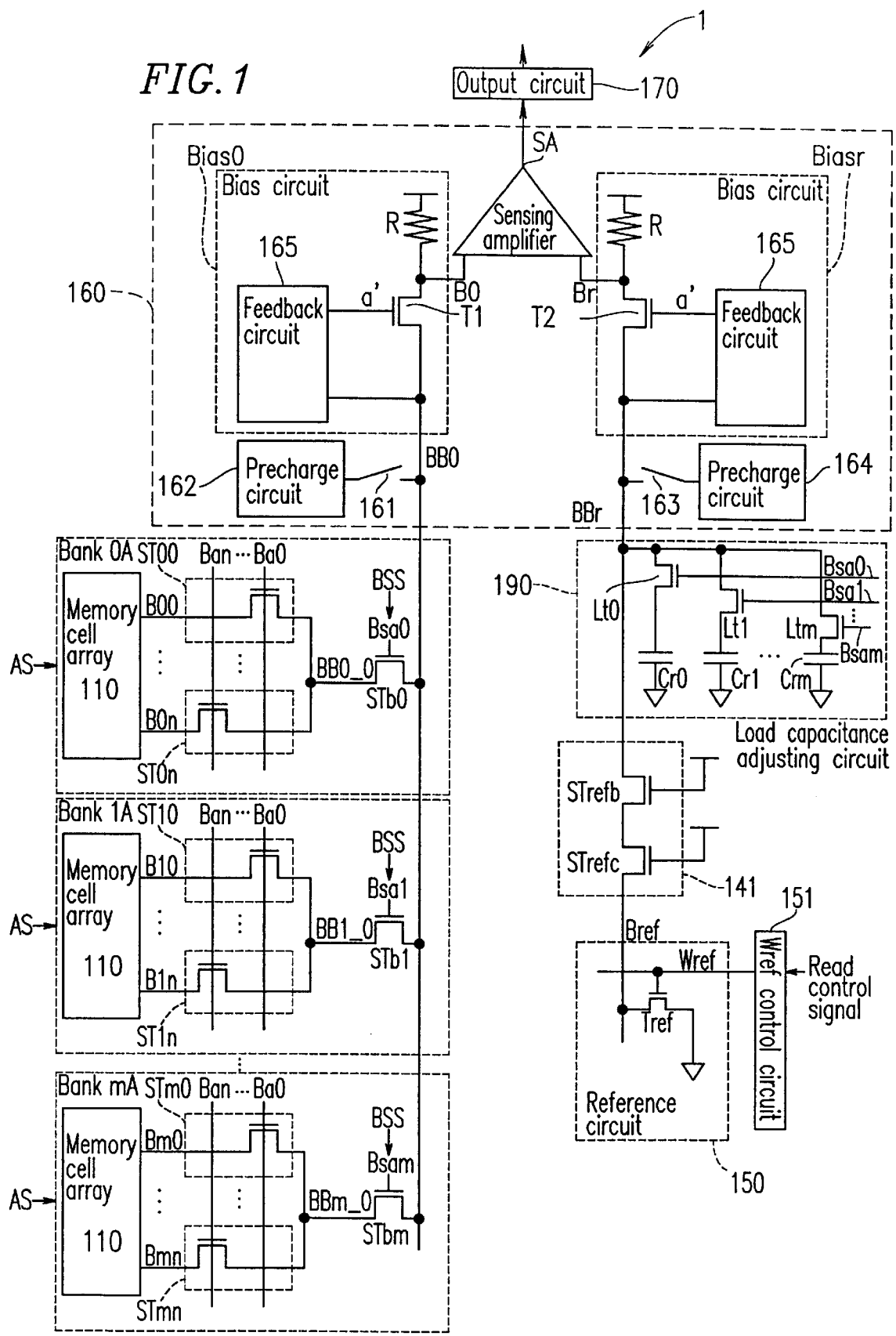
FIG. 1 is a schematic block diagram illustrating a structure of a semiconductor memory device in a first example according to the present invention.
Figure 8:
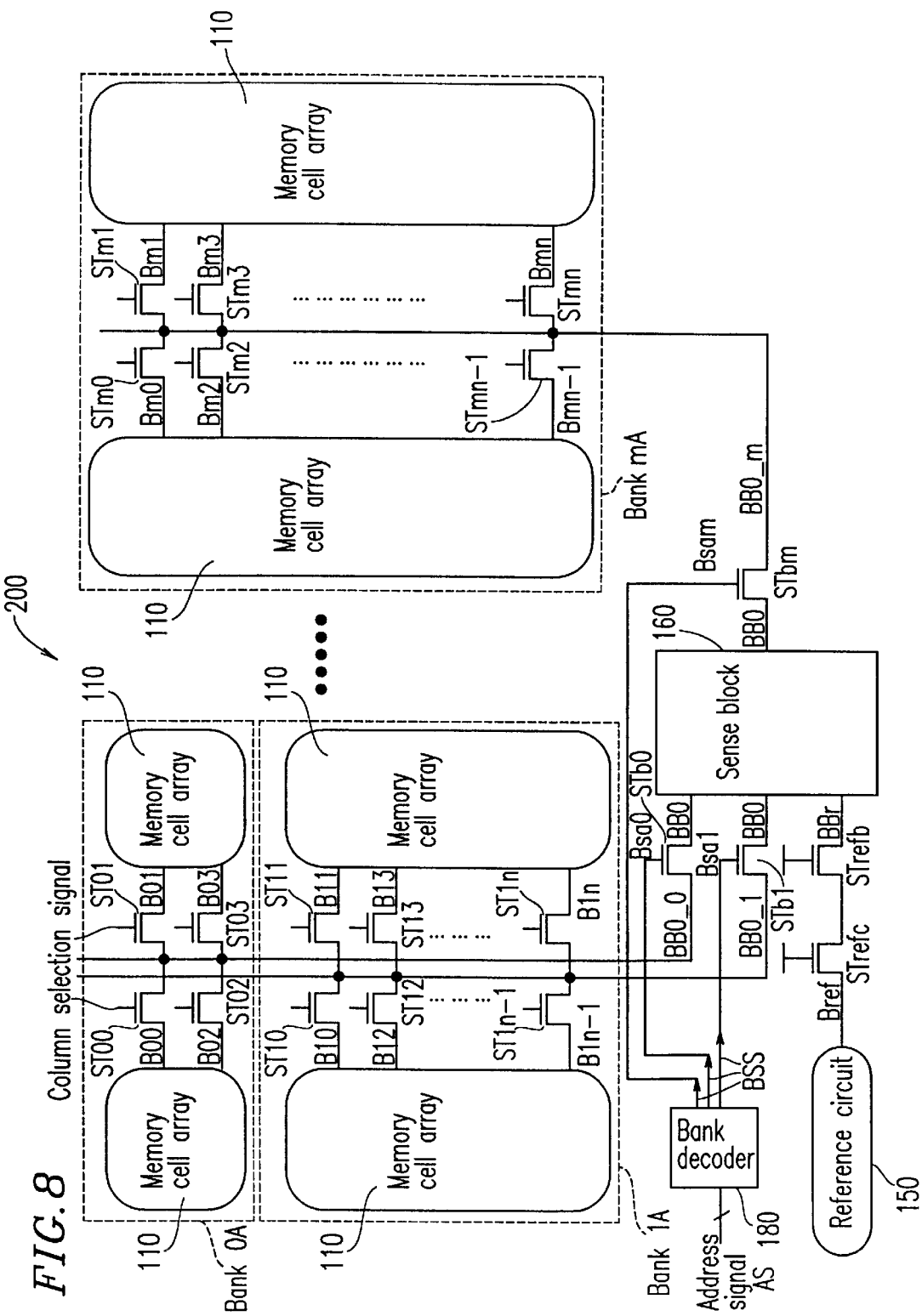
FIG. 8 is a schematic block diagram illustrating a structure of another conventional semiconductor memory device including a plurality of banks.

FIG. 1 is a circuit diagram illustrating a structure of a semiconductor memory device 1 in a first example according to the present invention. Identical elements previously discussed with respect to FIGS. 6 and 8 bear identical reference numerals and the detailed descriptions thereof will be omitted. In the following description, m and n are each an integer of 0 or more.

In FIG. 1, the semiconductor memory device 1 includes a plurality of banks (memory banks) 0A, 1A, . . . , and mA each including a memory cell array 110 having a plurality of memory cells MC. In accordance with one input address signal AS, one of the memory cells MC is selected from all the memory cells MC in the semiconductor memory device 1.

The bank 0A includes a memory cell array 110, a plurality of bit lines B00 through B0n, switching transistors ST00 through ST0n (each forming a switching circuit), a bit line BB0_0, and a switching transistor STb0. The bit lines B00 through B0n are connected to the bit line BB0_0 respectively through the switching transistors ST00 through ST0n. One of the bit lines B00 through B0n is selected by the row decoder 120 (see FIG. 6) by an input address signal AS. Each switching transistor ST00 through ST0n has a gate for receiving a column selection signal which is output from the column pre-decoder 131 (see FIG. 6). The bit line BB0_0 is connected to a memory bit line BB0 (i.e., an input of a sense block 160) through the switching transistor STb0. A gate of the switching transistor STb0 is connected to a bank selection signal line Bsa0. A bank selection signal BSS can be input to the bank selection signal line Bsa0. The bank selection signal is generated by a bank decoder circuit 180 (see FIG. 8). More specifically, the bank decoder circuit 180 decodes a bank selection signal BSS from an input address signal AS and outputs the bank selection signal BSS to the bank selection signal line BSa.

The bank 1A includes a memory cell array 110, a plurality of bit lines B10 through B1n, switching transistors ST10 through ST1n (each forming a switching circuit), a bit line BB1_0, and a switching transistor STb1. The bit lines B10 through B1n are connected to the bit line BB1_0 respectively through the switching transistors ST10 through ST1n. Each switching transistor ST10 through ST1n has a gate for receiving a column selection signal which is output from the column pre-decoder 131. The bit line BB1_0 is connected to the memory bit line BB0 through the switching transistor STb1. A gate of the switching transistor STb1 is connected to a bank selection signal line Bsa1.

The bank mA includes a memory cell array 110, a plurality of bit lines Bm0 through Bmn, switching transistors STm0 through STmn (each forming a switching circuit), a bit line BBm_0, and a switching transistor STbm. The bit lines Bm0 through Bmn are connected to the bit line BBm_0 respectively through the switching transistors STm0 through STmn. Each switching transistor STm0 through STmn has a gate for receiving a column selection signal which is output from the column pre-decoder 131. The bit line BBm_0 is connected to the memory bit line BB0 through the switching transistor STbm. A gate of the switching transistor STbm is connected to a bank selection signal line Bsam.

As described above, the bit lines B00 through B0n, B10 through B1n, . . . , Bm0 through Bmn, which are output lines from the memory cell arrays 110, are respectively connected to the bit lines BB0_0, BB1_0, . . . , and BBm_0 through the switching transistors ST00 through ST0n, ST10 through ST1n, . . . , STm0 through STmn. The gates of the switching transistors ST00 through ST0n, ST10 through ST1n, . . . , STm0 through STmn are respectively connected to column selection signal lines Ba0 through Ban (having the same function as that of the column selection signal lines Ba0 through Bam shown in FIG. 6). The second bit lines BB0_0, BB1_0, . . . , and BBm_0 are connected to the sense block 160 respectively through the switching transistors STb0 through STbm and through the memory bit line BB0. The gates of the switching transistors STb0 through STbm are respectively connected to bank selection signal lines Bsa0 through Bsam (having the same function as that of the bank selection signal lines Bsa0 through Bsam shown in FIG. 8).

The semiconductor memory device 1 further includes a switching circuit 141 for adjusting a resistance of a reference bit line BBr, a reference circuit 150 for setting a reference voltage level, a sense block 160 for comparing the set reference voltage level and a voltage level from a memory cell MC and amplifying the difference between the voltage levels so as to output the memory data, an output circuit 170 for sending the output from the sense block 160 to the outside the semiconductor memory device 1, and a load capacitance adjusting circuit 190 (load capacitance adjusting device) for connecting the reference bit line BBr to at least one of a plurality of load capacitors (load capacitance elements).

The sense block 160 includes a sensing amplifier SA as a comparison and amplification device for comparing a preset reference voltage level and a voltage level of data from the selected memory cell MC and amplifying and outputting the difference between the voltage levels, precharge circuits 162 and 164 for high-speed charging, and bias circuits Bias0 and Biasr for obtaining the one input voltage to the sensing amplifier SA.

The load capacitance adjusting circuit 190 includes a series circuit of a transistor Lt0 as a first switching device and an adjusting load capacitor Cr0, a series circuit of a transistor Lt1 as another first switching device and an adjusting load capacitor Cr1, . . . , a series circuit of a transistor Ltm as still another first switching device and an adjusting load capacitor Crm. The series circuits are connected parallel to one another to the reference bit line BBr.

The load capacitance adjusting circuit 190 uses the bank decoder 180 (see FIG. 8) for selecting a bank in accordance with an input address signal AS also as a switch controlling device. The bank selection signal lines Bsa0 through Bsam for receiving a bank selection signal from the bank decoder 180 are respectively connected to gates (i.e., controls) of the transistors Lt0 through Ltm.

In this example, the adjusting load capacitors Cr0 through Crm are provided respectively for the banks 0A through mA (i.e., one to one). The adjusting load capacitors Cr0 through Crm are set so that a load capacitance (herein, floating capacitance) of the memory bit line BB0 connected to the bank including the selected memory cell is equal to a load capacitance (herein, floating capacitance) of the reference bit line BBr. That is, the adjusting load capacitors Cr0 through Crm are set so that a load capacitance of the memory bit line BB0 from the selected memory cell MC to the sensing amplifier SA is equal to a load capacitance of the reference bit line BBr from the reference cell Tref to the sensing amplifier SA.

More specifically, the adjusting load capacitor Cr0 has a capacitance which is equal to the floating capacitance from a memory cell MC in the bank 0A to the sensing amplifier SA. The adjusting load capacitor Cr1 has a capacitance which is equal to the floating capacitance from a memory cell MC in the bank 1A to the sensing amplifier SA. The adjusting load capacitor Crm has a capacitance which is equal to the floating capacitance from a memory cell MC in the bank mA to the sensing amplifier SA.

The adjusting load capacitors Cr0 through Crm can be switched so that the load capacitance in accordance with the bank including the memory cell MC to be accessed can be selected. The switching operation is performed by one of the switching transistors Lt0 through Ltm so that, for example, the adjusting load capacitor Cr0 is connected to the reference bit line BBr for accessing a memory cell MC in the bank 0A, the adjusting load capacitor Cr1 is connected to the reference bit line BBr for accessing a memory cell MC in the bank 1A, and the adjusting load capacitor Crm is connected to the reference bit line BBr for accessing a memory cell MC in the bank mA. The switching transistors Lt0 through Ltm are controlled by the bank selection signal BSS.

The semiconductor memory device 1 operates as follows.

An address signal AS is input to the row decoder 120. In accordance with the address information of input address signal AS, the row decoder 120 sends a word line selection signal to a selected word line W (see FIG. 6) (more specifically, to the control gates G of the memory cells MC of the selected row). The address signal AS is also input to the column pre-decoder 131 (see FIG. 6). In accordance with the address information of the input address signal AS, the column pre-decoder 131 sends a column selection signal to a selected column selection signal line Ba, which is then provided with an active voltage. Thus, a memory cell MC to be accessed is selected. One of the bank selection signal lines Bsa0 through Bsam which corresponds to the bank which includes the selected memory cell MC is provided with an active voltage. The memory bit line BB0 obtains a voltage based on a threshold voltage of the selected memory cells MC as described below.

Figure 7:
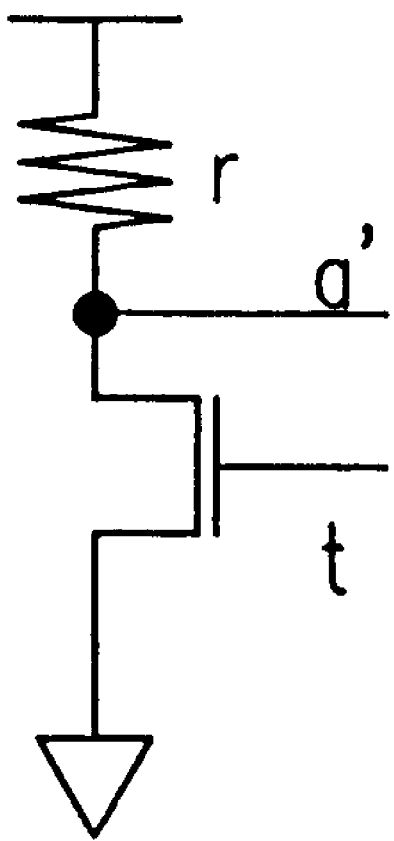
FIG. 7 is a circuit configuration of an example of a feedback circuit.

When the threshold voltage of the selected memory cell MC is set to be higher than the desired active voltage applied on the word line W, the selected memory cell MC (e.g., MC000) is not placed into a conductive state. Therefore, a charging current from the precharge circuit 162 is shielded by the memory cell MC000 connected to the precharge circuit 162 via the switching transistor ST00 and the switching transistor STb0, and thus the voltage of the memory bit line BB0 is maintained high. As a result, the transistor t (FIG. 7) in the feedback circuit 165 is placed into a conductive state so as to make the voltage of the connection point a' low, thus placing the transistor T1 (n-channel transistor for a transfer gate) into a high resistance state (i.e., off state). Accordingly, when the threshold voltage of the selected memory cell MC is set to be higher than the desired voltage applied on the word line W, the input B0 of the sensing amplifier SA is supplied with a high level voltage.

When the threshold voltage of the selected memory cell MC is set to be lower than the desired voltage applied on the word line W, the selected memory cell MC (e.g., MC000) is placed into a conductive state. Therefore, a charging current from the precharge circuit 162 flows through the memory cell MC000 through the switching transistor ST00 and the switching transistor STb0, and thus the voltage of the memory bit line BB0 is maintained low. As a result, the transistor t (FIG. 7) in the feedback circuit 165 is not placed into a conductive state, and thus the voltage of the connection point a' becomes high. The transistor T1 is placed into a low resistance state (i.e., on state). Accordingly, when the threshold voltage of the selected memory cell MC is set to be lower than the desired active voltage applied on the word line W, the input B0 of the sensing amplifier SA is provided with a low voltage level.

Figure 6:
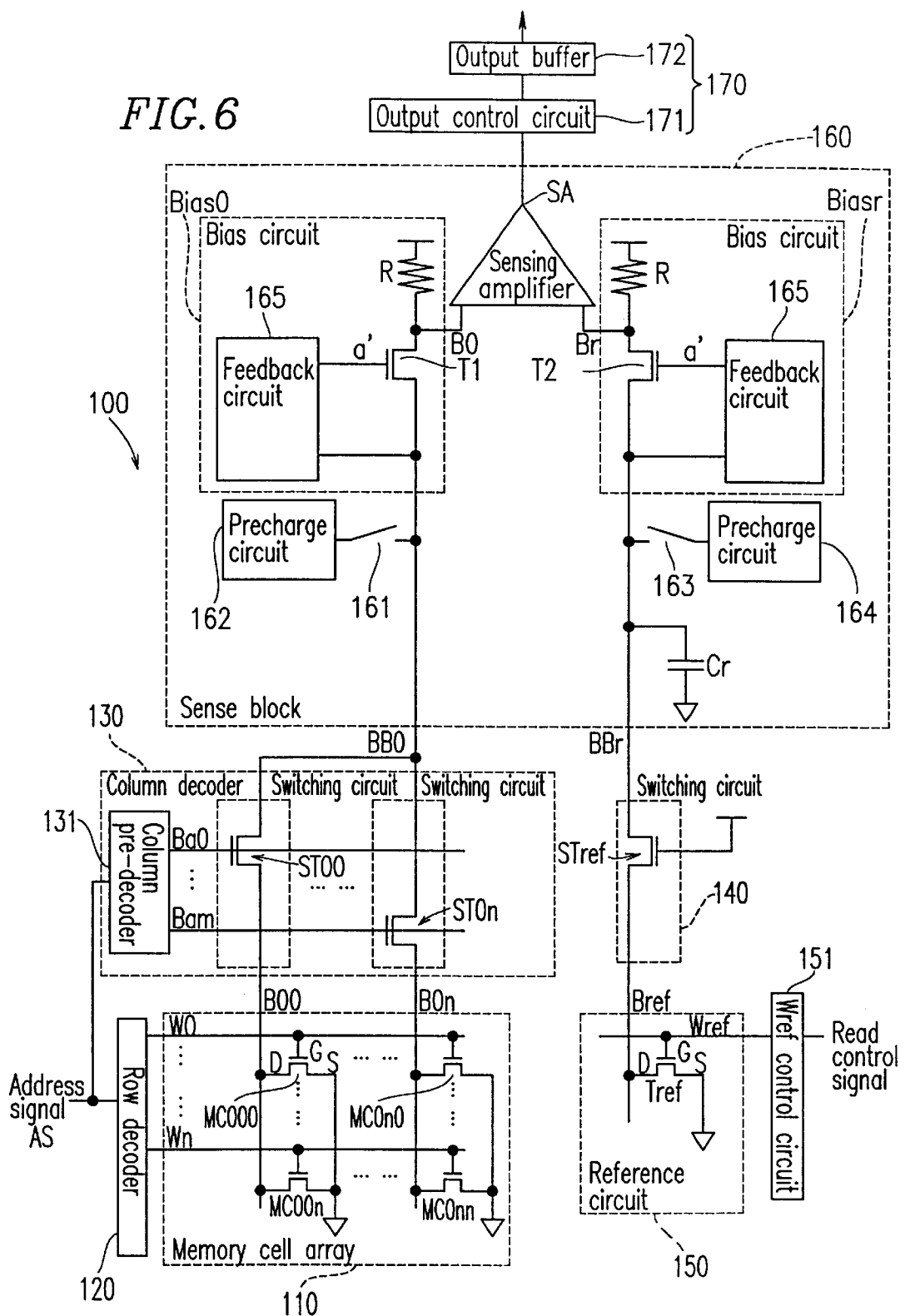
FIG. 6 is a schematic block diagram illustrating a structure of a conventional semiconductor memory device.

The reference word line Wref (having the same function as that of the reference word line Wref shown in FIG. 6) connected to the gate of the reference cell Tref is provided with a voltage having an equal value to that of a voltage applied to the selected word line W in a memory cell array 110. This way, the reference cell Tref is adjusted to have an appropriate threshold voltage so that the reference voltage input to the input Br of the sensing amplifier SA is at a substantially middle point between the high level and the low level which can be applied to the input B0 of the sensing amplifier SA by the function of the precharge circuit 164 and the bias circuit Biasr.

Hereinafter, a floating capacitance existing in the semiconductor memory device 1 will be described. Generally, the memory bit line BB0_0 is connected to a plurality of memory cells MC parallel to each other through the switching transistors ST00 through ST0n. Therefore, the bit lines B00 through B0n need to be sufficiently long to be connected to the plurality of memory cells MC. In such a structure, a relatively large floating capacitance exists. The precharge circuit 162 performs a precharge operation so as to charge, at a high speed, a floating capacitance of the bit line B selected by the switching transistors ST00 through ST0n before the sensing amplifier SA starts operating. During the operation of the sensing amplifier SA, the precharge circuit 162 is separated from the memory bit line BB0 by the switch circuit 161 and thus does not perform a precharge operation.

When the floating capacitance of the memory bit line BB0 and the floating capacitance of the reference bit line BBr are different, the precharge time period of the memory bit line BB0 and the precharge time period of the reference bit line BBr are different. In order to make the two precharge time periods equal, the load capacitances needs to be adjusted to be equal to each other using the adjusting load capacitors Cr0 through Crm.

For example, for accessing a memory cell in the bank 0A, the bank selection signal line Bsa0 becomes active and thus the transistor Lt0 corresponding to the bank 0A becomes active. The adjusting load capacitor Cr0 having a load capacitance which is substantially equal to the load capacitance of the bank 0A is connected to the reference bit line BBr through the transistor Lt0. As a result, the floating capacitance of the reference bit line BBr becomes equal to the floating capacitance of the memory bit line BB0 connected to the bank 0A.

For accessing a memory cell in the bank 1A, the bank selection signal line Bsa1 becomes active and thus the transistor Lt1 corresponding to the bank 1A becomes active. The adjusting load capacitor Cr1 having a load capacitance which is substantially equal to the load capacitance of the bank 1A is connected to the reference bit line BBr through the transistor Lt1. As a result, the floating capacitance of the reference bit line BBr becomes equal to the floating capacitance of the memory bit line BB0 connected to the bank 1A.

For accessing a memory cell in the bank mA, the bank selection signal line Bsam becomes active and thus the transistor Ltm corresponding to the bank mA becomes active. The adjusting load capacitor Crm having a load capacitance which is substantially equal to the load capacitance of the bank mA is connected to the reference bit line BBr through the transistor Ltm. As a result, the floating capacitance of the reference bit line BBr becomes equal to the floating capacitance of the memory bit line BB0 connected to the bank mA.

As described above, the semiconductor memory device 1 in the first example of the present invention uses the reference cell Tref to generate a reference voltage level. The reference voltage level is compared with a voltage level of the selected memory cell MC, and the difference between the voltage levels is amplified and output. In the semiconductor memory device 1 operating in this manner, the adjusting load capacitors Cr0 through Crm are provided so as to respectively correspond to the banks 0A through mA. One of the adjusting load capacitors Cr0 through Crm which corresponds to the bank selected by the address signal AS is connected to the reference bit line BBr through the corresponding transistor Lt. According to such a structure, when the number of banks increases or decreases, the number of load capacitors can be increased or decreased. Therefore, the load capacitance from the selected memory cell MC to the sensing amplifier SA can always be adjusted to be equal to the load capacitance of the reference bit line BBr. Thus, the sensing margin is improved, and the access time (i.e., sensing speed) is reduced.

EXAMPLE 2

In the first example described above with reference to FIG. 1, the adjusting load capacitances of an equal number to the number of the banks are provided. In a second example according to the present invention, the adjusting load capacitances of a smaller number than the number of the banks are provided. In this example, four banks are provided, but the present invention is applicable to a structure having any number of banks.

Figure 2:
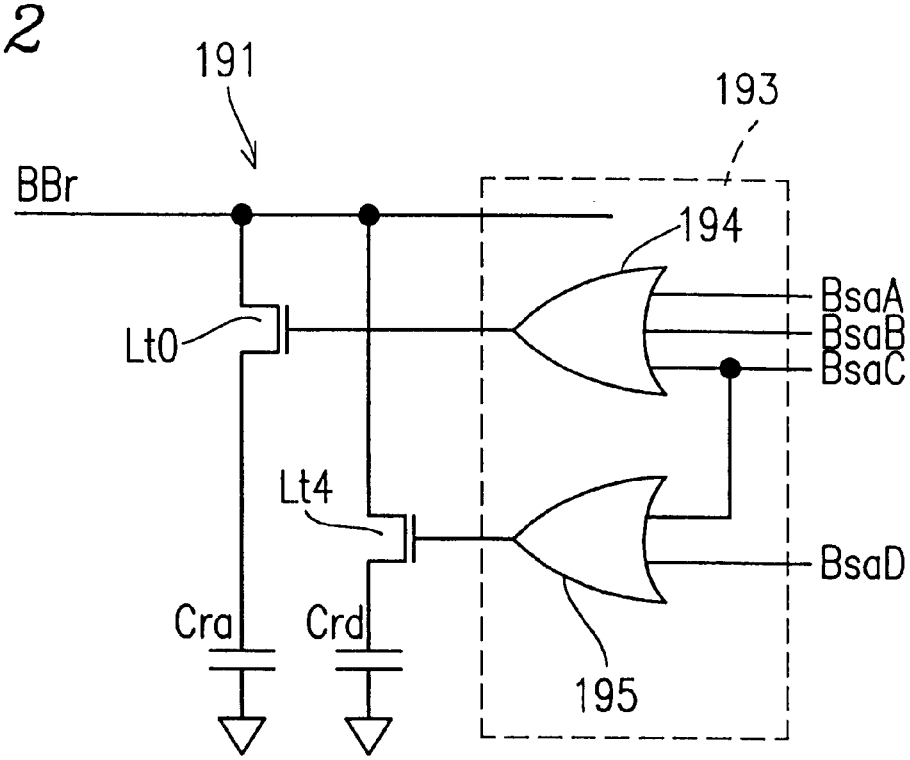
FIG. 2 is a circuit configuration illustrating a structure of a load capacitance adjusting circuit in a second example according to the present invention, which is usable in the semiconductor memory device shown in FIG. 1.

FIG. 2 is a circuit configuration of a load capacitance adjusting circuit 191 in the second example according to the present invention, which can be included in the semiconductor memory device 1 shown in FIG. 1 in place of the load capacitance adjusting circuit 190.

As shown in FIG. 2, the load capacitance adjusting circuit 191 includes a logic circuit 193 as a switching device for receiving a bank selection signal for selecting one of the banks 0A through mA (FIG. 1) in accordance with an input address signal AS. The logic circuit 193 includes OR gates 194 and 195. An input of the OR gate 194 is connected to bank selection signal lines BsaA, BsaB and BsaC, and an input of the OR gate 195 is connected to the bank selection signal lines BsaC and BsaD. (The bank selection signal lines BsaA, BsaB, BsaC and BsaD have the same function as that of the bank selection signal lines Bsa0 through Bsam shown in FIG. 1.)

A series circuit of the transistor Lt0 (as a first switching device) and an adjusting load capacitor Cra, and a series circuit of the transistor Lt4 (as another first switching device) and an adjusting load capacitor Crd which are parallel to each other are connected to the reference bit line BBr. Gates (i.e., controls) of the transistors Lt0 and Lt4 are respectively connected to outputs of the OR gates 194 and 195. In this manner, the reference bit line BBr is connected to at least one of the adjusting load capacitors Cra and Crd which have a respective load capacitance equal to the load capacitance of the memory bit line BB0 connected to the selected bank (one of the banks 0A through mA).

Figure 3:
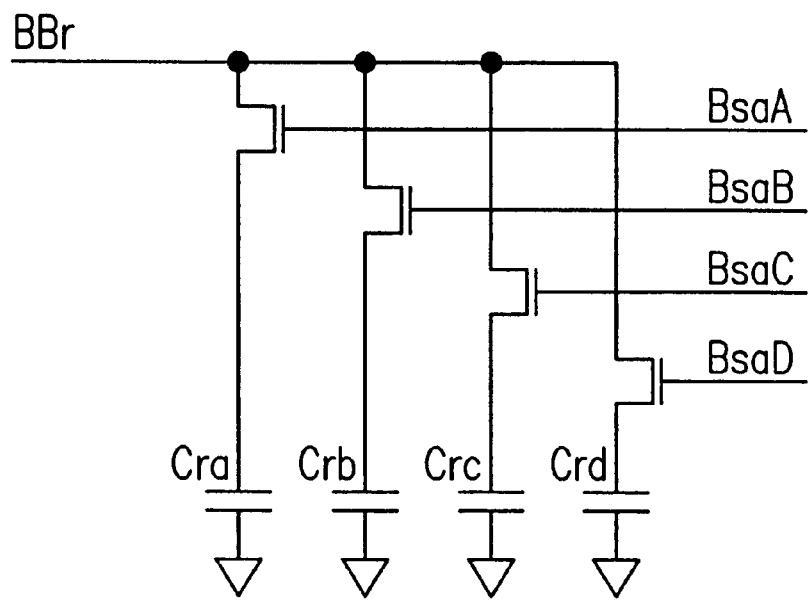
FIG. 3 is a circuit configuration used for illustrating the load capacitance adjusting circuit shown in FIG. 2.

This will be described more specifically with reference to FIG. 3. In FIG. 3, the adjusting load capacitor Cra is used for accessing a bank A (not shown) connected to the bank selection signal line BsaA (i.e., bank selection signal line BsaA becomes active when accessing the bank A). The adjusting load capacitor Crb is used for accessing a bank B (not shown) connected to the bank selection signal line BsaB (i.e., bank selection signal line BsaB becomes active when accessing the bank B). The adjusting load capacitor Crc is used for accessing a bank C (not shown) connected to the bank selection signal line BsaC (i.e., bank selection signal line BsaC becomes active when accessing the bank C). The adjusting load capacitor Crd is used for accessing a bank D (not shown) connected to the bank selection signal line BsaD (i.e., bank selection signal line BsaD becomes active when accessing the bank D). (The adjusting load capacitors Cra, Crb, Crc and Crd have the same function as that of the adjusting load capacitors Cr0 through Crm shown in FIG. 1. The banks A, B, C and D have the same function as that of the banks 0A through mA shown in FIG. 1).

When, for example, the load capacitance of the adjusting load capacitor Cra is equal to the load capacitance of the adjusting load capacitor Crb and the load capacitance of the adjusting load capacitor Crc is equal to the sum of the load capacitances of the adjusting load capacitors Cra and Crd, it is not necessary to provide four adjusting load capacitors. The two adjusting load capacitors Cra and Crd are sufficient as shown in FIG. 2 so long as the bank selection signal for activating the bank selection signal line BsaA, BsaB, BsaC or BsaD is appropriately decoded by the logic circuit 193 as follows.

For accessing a memory cell MC in the bank A or B, a bank selection signal is output to the bank selection signal line BsaA or BsaB, and then a signal is output from the OR gate 194. The signal from the OR gate 194 turns on the transistor Lt0, which connects the adjusting load capacitor Cra to the reference bit line BBr.

For accessing a memory cell MC in the bank C, a bank selection signal is output to the bank selection signal line BsaC, and then a signal is output from each of the OR gates 194 and 195. The signals from the OR gates 194 and 195 turn on the transistors Lt0 and Lt4, which connect the adjusting load capacitors Cra and Crd to the reference bit line BBr.

For accessing a memory cell MC in the bank D, a bank selection signal is output to the bank selection signal line BsaD, and then a signal is output from the OR gate 195. The signal from the OR gate 195 turns on the transistor Lt4, which connects the adjusting load capacitor Crd to the reference bit line BBr.

As described above, in the second example according to the present invention, a bank selection signal which is originally for selecting a bank is also used for adjusting a load capacitance. This is realized by appropriately decoding the bank selection signal by the logic circuit 193. Although the logic circuit 193 is additionally required, the load capacitance can be adjusted by a much smaller number of adjusting load capacitors than the number of the banks. This is realized by switching the adjusting load capacitor or capacitors to be connected to the reference bit line BBr in various manners. Thus, the number of required adjusting load capacitors is reduced, and the number of series circuits including the switching transistors is also reduced.

EXAMPLE 3

The memory cell array 110 in each bank can be required to have a varied size in accordance with the use of the semiconductor memory device 1 or the system configuration. Therefore, it is desirable that the size of the memory cell array 110 in each bank is variable even though the total size of all the memory cell arrays 110 in the semiconductor memory device 1 remains the same. In a third example according to the present invention, the size of the memory cell array 110 in each bank is variable, and the load capacitance of the adjusting load capacitor or capacitors to be connected to the reference bit line BBr is variable in accordance with the size of the memory cell array 110.

Figure 4:
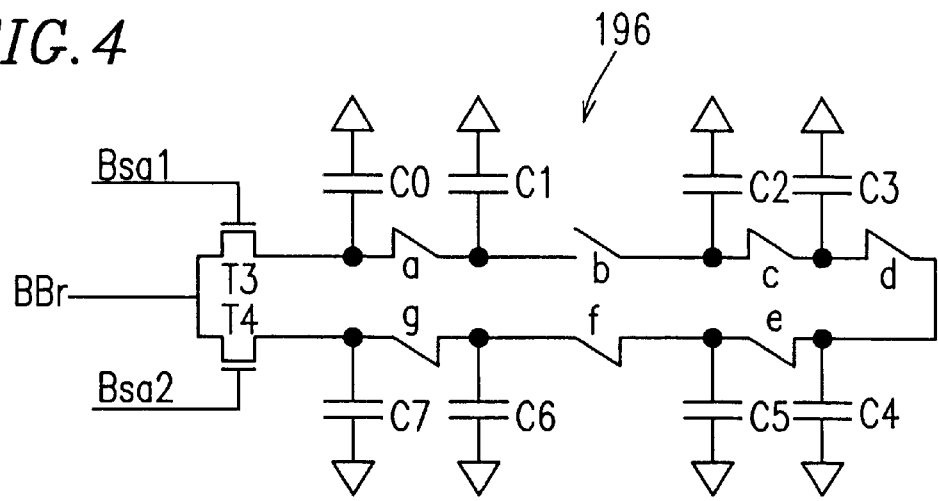
FIG. 4 is a circuit configuration illustrating a structure of a load capacitance adjusting circuit in a third example according to the present invention, which is usable in the semiconductor memory device shown in FIG. 1.

FIG. 4 is a circuit configuration of a load capacitance adjusting circuit 196 in the third example according to the present invention, which can be included in the semiconductor memory device 1 shown in FIG. 1 in place of the load capacitance adjusting circuit 190.

As shown in FIG. 4, the load capacitance adjusting circuit 196 includes adjusting load capacitors C0, C1, C2, ... C6, and C7 connected in an annular manner, and switches a through g (as second switching devices) between respective adjacent load capacitors of the adjusting load capacitors C0, C1, C2, ... C6, and C7 except for between the adjusting load capacitors C0 and C7. The switches a through g can separate the two adjacent adjusting load capacitors except for the adjusting load capacitors C0 and C7. As the size of the memory cell array 110 (FIG. 1) in each bank changes, the adjusting load capacitors can easily be switched so that the load capacitance of the memory bit line BB0 and the load capacitance of the reference bit line BBr are equal to each other. One of two ends of each adjusting load capacitors C0 through C7 is grounded.

Transistors T3 and T4 (as third and fourth switching devices) are provided in series between the adjusting load capacitors C0 and C7. A connection point between the transistors T3 and T4 is connected to the reference bit line BBr. Gates (i.e., controls) of the transistors T3 and T4 are respectively connected to bank selection signal lines Bsa1 and Bsa2 to which a bank selection signal can be input.

The size of each of the banks 0A through mA (FIG. 1) is usually constant in the semiconductor memory device 1. The adjusting load capacitances can be separated from each other by electric disconnection by use of transistors, by turning off the connection point between the lines, or directly cutting the lines.

The connection and separation of the load capacitors C0 through C7 are adjusted by the switches a through g so that the resultant load capacitance is equal to the load capacitance in a memory cell array region after the size change of the memory cell arrays in the banks. This will be described in detail with reference to FIGS. 5A and 5B.

Figure 5A:
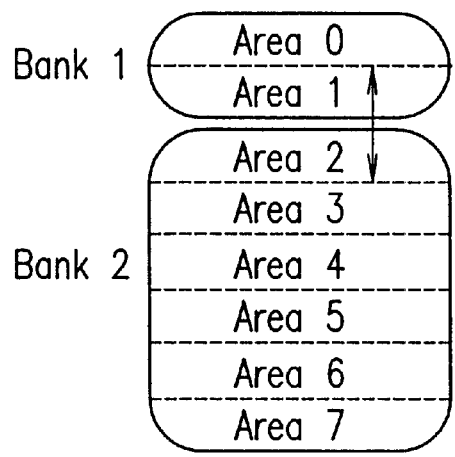
FIG. 5A shows a bank structure in the semiconductor memory device according to the present invention.
Figure 5B:
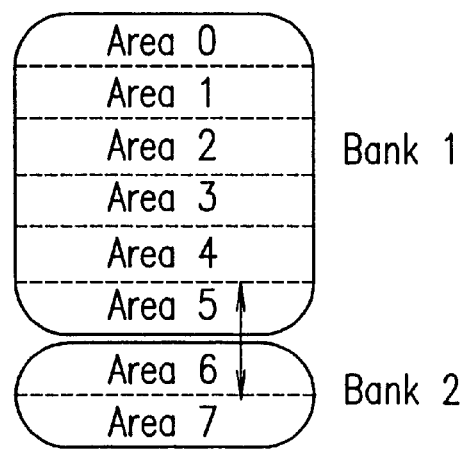
FIG. 5B shows another bank structure in the semiconductor memory device according to the present invention.

FIGS. 5A and 5B are schematic views of a structure of a memory cell array region, which can be the total of the memory cell arrays 110 in the semiconductor memory device 1. The load capacitance of the adjusting load capacitor C0 in FIG. 4 is equal to a load capacitance of area 0 of the memory cell array region. The load capacitance of the adjusting load capacitor C1 is equal to a load capacitance of area 1 of the memory cell array region. The load capacitance of the adjusting load capacitors C2 through C7 are respectively equal to load capacitances of areas 2 through 7 of the memory cell array region.

In the case where areas 0 and 1 are included in bank 1 and areas 2 through 7 are included in bank 2 as shown in FIG. 5A, the border between banks 1 and 2 is the border between areas 1 and 2. Accordingly, the switch b between the adjusting load capacitors C1 and C2 is turned off for separating the load capacitors C0 and C1 from the capacitors C2 through C7 as shown in FIG. 4. (Banks 1 and 2 have the same function as that of the banks 0A through mA shown in FIG. 1.)

In the case where areas 0 through 5 are included in bank 1 and areas 6 and 7 are included in bank 2, the border between banks 1 and 2 is the border between areas 5 and 6. Accordingly, the switch b between the adjusting load capacitors C1 and C2 is turned back on, and the switch f is turned off for separating the load capacitors C0 through C5 from the load capacitors C6 and C7. The switches a through g are turned on or off by a switch controlling device (not shown). The switch controlling device can turn the switches a through g on or off using a logical signal obtained by decoding an area change signal for the banks by a logic circuit.

For accessing areas 0 and 1 shown in FIG. 5A, the bank selection signal line Bsa1 (FIG. 4) becomes active to activate the transistor T3 (ON state), and turns off the switch b. Thus, the adjusting load capacitors C0 and C1 corresponding to areas 0 and 1 are connected to the reference bit line BBr through the transistor T3.

For accessing areas 2 through 7 shown in FIG. 5A, the bank selection signal line Bsa2 (FIG. 4) becomes active to activate the transistor T4 (ON state), and turns off the switch b. Thus, the adjusting load capacitors C2 through C7 corresponding to areas 2 through 7 are connected to the reference bit line BBr through the transistor T4.

For accessing areas 0 through 5 shown in FIG. 5B after the size of bank 1 is changed from areas 0 and 1 to areas 0 through 5, the bank selection signal line Bsa1 (FIG. 4) becomes active to activate the transistor T3, and turns off the switch f. Thus, the adjusting load capacitors C0 through C5 corresponding to areas 0 through 5 are connected to the reference bit line BBr through the transistor T3.

As described above, in the third example, the load capacitor connected to the reference bit line BBr is variable in accordance with the size of the varied memory cell array 110. Therefore, when the size of the memory cell array 110 in each bank can be varied in correspondence with the use of the semiconductor memory device 1 or the system configuration while the total size of the memory cell arrays 110 is kept the same, the load capacitance of the bit line from the memory cell MC to the sensing amplifier SA can be adjusted to be equal to the load capacitance of the reference bit line BBr from the reference cell Tref to the sensing amplifier SA. Thus, the sensing margin is improved, and the access time (i.e., sensing speed) is reduced.

In the first through third examples, a plurality of adjusting load capacitors are provided so that one or more of them are selected in various manners. The present invention is not limited to this. For example, one capacitance-variable adjusting load capacitor or a plurality of capacitance-variable adjusting load capacitors can be provided. A capacitance-variable load capacitor and a capacitance-fixed load capacitor can be combined.

In the first through third examples, the capacitors are used as adjusting load capacitors. Alternatively, any device which can adjust a capacitance, such as, for example, diffusion capacitances and gate capacitances of transistors, can be used.

The load capacitance refers to a floating capacitance or a parasitic capacitance.

According to the present invention, an adjusting load capacitor having a load capacitance which is substantially equal to that of the memory bank selected by the address signal is connected to the reference bit line. Even when the number of banks is increased or decreased, the load capacitance from the memory cell to the sensing amplifier can be equal to the load capacitance from the reference cell to the sensing amplifier. The sensing margin is improved, and the access time (i.e., sensing speed) is reduced.

According to the present invention, a plurality of first switching devices each connected to a plurality of load capacitors are provided. The load capacitors are switched over so that the load capacitance of the memory bit line and the load capacitance of the reference bit line can be equal to each other. Therefore, the structure of the load capacitance adjusting circuit can be simplified.

According to the present invention, a signal for selecting a bank is also used for switching the first switching device. Therefore, the structure of the load capacitance adjusting circuit can be simplified.

According to the present invention, the load capacitors are combined appropriately by a logic circuit which receives a bank selection signal, so that the load capacitance of the memory bit line and the load capacitance of the reference bit line can be equal to each other. Therefore, it is not necessary to provide one load capacitor for each bank. The number of load capacitors can be reduced.

According to the present invention, when the size of the memory cell arrays in each bank is varied in correspondence with the use of the semiconductor memory device or the system configuration while the total size of the memory cell arrays is kept the same, the load capacitance of the bit line can be adjusted to be equal to the load capacitance of the reference bit line. Thus, the sensing margin is improved, and the access time (i.e., sensing speed) is reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
    a plurality of memory banks each including a plurality of memory cells, one of which is selectable in accordance with an address signal;
    a memory bit line for receiving a read voltage from the selected memory cell;
    a reference cell for outputting a reference voltage;
    a reference bit line for receiving the reference voltage;
    a comparison and amplification device for amplifying a difference between a voltage from the memory bit line and a voltage from the reference bit line; and
    a load capacitance adjusting device for providing a third load capacitance to the reference bit line so that a first load capacitance between the selected memory cell and the comparison and amplification device is substantially equal to a second load capacitance between the reference cell and the comparison and amplification device.

2. A semiconductor memory device according to claim 1, wherein the load capacitance adjusting device includes:
    a plurality of load capacitance elements having a respective load capacitance, and
    a plurality of first switching devices for electrically connecting at least one of the plurality of load capacitance elements to the reference bit line.

3. A semiconductor memory device according to claim 2, further comprising a plurality of bank selection signal lines respectively connected to the plurality of memory banks for receiving a bank selection signal for selecting one of the plurality of memory banks which includes the selected memory cell, wherein the plurality of first switching devices are respectively connected to the plurality of bank selection signal lines.

4. A semiconductor memory device according to claim 2, further comprising a plurality of bank selection signal lines respectively connected to the plurality of memory banks for receiving a bank selection signal for selecting one of the plurality of memory banks which include the selected memory cell, wherein the load capacitance adjusting device further includes a logic circuit which is connected to the plurality of first switching devices for controlling switching of the plurality of first switching devices in accordance with the bank selection signal.

5. A semiconductor memory device according to claim 1, wherein the load capacitance adjusting device includes second switching devices between respective adjacent load capacitance elements of the plurality of load capacitance elements, and controls each of the second switching devices to be on or off so as to provide the third load capacitance to the reference bit line.

6. A semiconductor memory device according to claim 5, wherein the plurality of load capacitance elements are divided into a group of first load capacitance elements, a total load capacitance of which forms the third load capacitance to be provided to the reference bit line when the selected memory cell is in a first memory bank among the plurality of memory banks, and a group of second load capacitance elements, a total load capacitance of which forms the third load capacitance to be provided to the reference bit line when the selected memory cell is in a second memory bank among the plurality of memory banks, as a result of each of the plurality of second switching devices being controlled to be on or off.

7. A semiconductor memory device according to claim 5, wherein the load capacitance adjusting device further includes a third switching device and a fourth switching device both connected to the reference bit line, wherein the third switching device is connected to one of two ends of the plurality of load capacitance elements which are connectable via the second switching devices, and the fourth switching device is connected to the other of the two ends of the plurality of load capacitance elements.

* * * * *